US010427550B2

(12) United States Patent
Martel et al.

(10) Patent No.: US 10,427,550 B2
(45) Date of Patent: Oct. 1, 2019

(54) METHOD FOR CHARGING AN ELECTRICALLY OPERATED VEHICLE WITH THE AID OF A CHARGING CABLE, CHARGING CABLE AND RESIDUAL CURRENT ARRANGEMENT FOR DETECTING A DIRECT CURRENT

(71) Applicant: Siemens Aktiengesellschaft, Munich (DE)

(72) Inventors: Jean-Mary Martel, Tegernheim (DE); Andreas Neundlinger, Straubing (DE); Florian Festl, Regensburg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 23 days.

(21) Appl. No.: 15/658,445

(22) Filed: Jul. 25, 2017

(65) Prior Publication Data

US 2018/0056802 A1    Mar. 1, 2018

(30) Foreign Application Priority Data

Aug. 31, 2016   (DE) .................... 10 2016 216 401

(51) Int. Cl.
*B60L 53/60*   (2019.01)
*G01R 15/18*   (2006.01)
(Continued)

(52) U.S. Cl.
CPC ............. *B60L 53/60* (2019.02); *B60L 3/0069* (2013.01); *B60L 3/04* (2013.01); *B60L 53/14* (2019.02);
(Continued)

(58) Field of Classification Search
CPC .. B60L 11/1838; B60L 11/1816; B60L 53/60; B60L 53/14; B60L 3/04;
(Continued)

(56) References Cited

U.S. PATENT DOCUMENTS 6,624,624 B1 * 9/2003 Karrer ................. G01R 15/181
324/117 R
6,646,430 B1 * 11/2003 Skerritt ................. G01R 1/203
324/126

(Continued)

FOREIGN PATENT DOCUMENTS

DE    102011107721 A1    1/2013
DE    102011084527 A1    4/2013
(Continued)

OTHER PUBLICATIONS

German Office Action dated Dec. 13, 2016.

*Primary Examiner* — M Baye Diao
(74) *Attorney, Agent, or Firm* — Harness, Dickey & Pierce, P.L.C.

(57) ABSTRACT

Embodiments generally relates to charging an electrically operated vehicle with the aid of a charging cable which is formed with a residual current arrangement for detecting a direct current. According to an embodiment of the invention, a charging process to be performed once again is identified by the charging cable, and a calibration of the residual current arrangement is performed before the charging process. According to another embodiment, a temperature monitoring operation is carried out during the charging process, a value for the change in temperature is ascertained, and, when a threshold value for the change in temperature is exceeded, the charging process is interrupted and a calibration of the residual current arrangement is performed.

24 Claims, 3 Drawing Sheets

(51) Int. Cl.
  *G01R 35/00* (2006.01)
  *B60L 3/00* (2019.01)
  *B60L 3/04* (2006.01)
  *B60L 53/14* (2019.01)
  *G01R 31/02* (2006.01)
  *G01R 31/00* (2006.01)

(52) U.S. Cl.
  CPC ........... *G01R 15/18* (2013.01); *G01R 31/025* (2013.01); *G01R 35/005* (2013.01); *B60L 2240/36* (2013.01); *G01R 31/006* (2013.01); *Y02T 10/7005* (2013.01); *Y02T 10/7072* (2013.01); *Y02T 90/14* (2013.01)

(58) Field of Classification Search
  CPC . B60L 3/0069; B60L 2240/36; G01R 31/025; G01R 35/005; G01R 15/18; G01R 31/006; Y02T 90/14; Y02T 10/7005; Y02T 10/7072
  USPC ............................ 320/109; 361/115; 324/126
  See application file for complete search history.

(56) References Cited

U.S. PATENT DOCUMENTS

| | | | | |
|---|---|---|---|---|
| 6,999,007 | B2* | 2/2006 | Lin | G01D 5/2073 178/18.06 |
| 9,156,362 | B2* | 10/2015 | Soden | B60L 3/04 |
| 9,632,164 | B2* | 4/2017 | Evans | G01R 35/02 |
| 9,678,112 | B2 | 6/2017 | Rathsmann | |
| 10,115,247 | B2* | 10/2018 | Alm | B60L 5/24 |
| 2003/0015990 | A1* | 1/2003 | Ermis | H04M 10/4257 320/101 |
| 2006/0028178 | A1* | 2/2006 | Hobbs | B60L 3/0046 320/128 |
| 2008/0012666 | A1 | 1/2008 | Davison et al. | |
| 2010/0090660 | A1* | 4/2010 | Eger | G01R 31/3835 320/153 |
| 2011/0270553 | A1* | 11/2011 | Ausserlechner | G01R 15/202 702/64 |
| 2011/0318010 | A1* | 12/2011 | Bai | H04B 10/25133 398/81 |
| 2013/0201641 | A1* | 8/2013 | Soden | B60L 3/04 361/752 |
| 2014/0021921 | A1* | 1/2014 | Thommes | B60L 3/0069 320/109 |
| 2014/0022686 | A1* | 1/2014 | Meisel | H01H 9/54 361/115 |
| 2014/0253102 | A1 | 9/2014 | Wood et al. | |
| 2015/0048839 | A1* | 2/2015 | Desrosiers | G01R 19/0092 324/433 |
| 2015/0251549 | A1* | 9/2015 | Hofer | B60L 3/00 320/109 |
| 2015/0346288 | A1* | 12/2015 | Hardy | G01R 21/133 702/58 |
| 2016/0156196 | A1* | 6/2016 | Warren | H02H 3/335 340/636.15 |
| 2016/0250939 | A1* | 9/2016 | Shin | H04B 3/54 320/109 |
| 2017/0095667 | A1* | 4/2017 | Yakovlev | A61N 1/36125 |
| 2017/0106764 | A1* | 4/2017 | Beaston | B60L 11/1838 |

FOREIGN PATENT DOCUMENTS

| | | |
|---|---|---|
| DE | 10 2012 217 447 | 8/2013 |
| DE | 102012208120 A1 | 11/2013 |
| DE | 102014210589 A1 | 12/2015 |
| EP | 3057190 A1 | 8/2016 |
| WO | WO 2010049775 A2 | 5/2010 |
| WO | WO 2014122647 A1 | 8/2014 |

\* cited by examiner

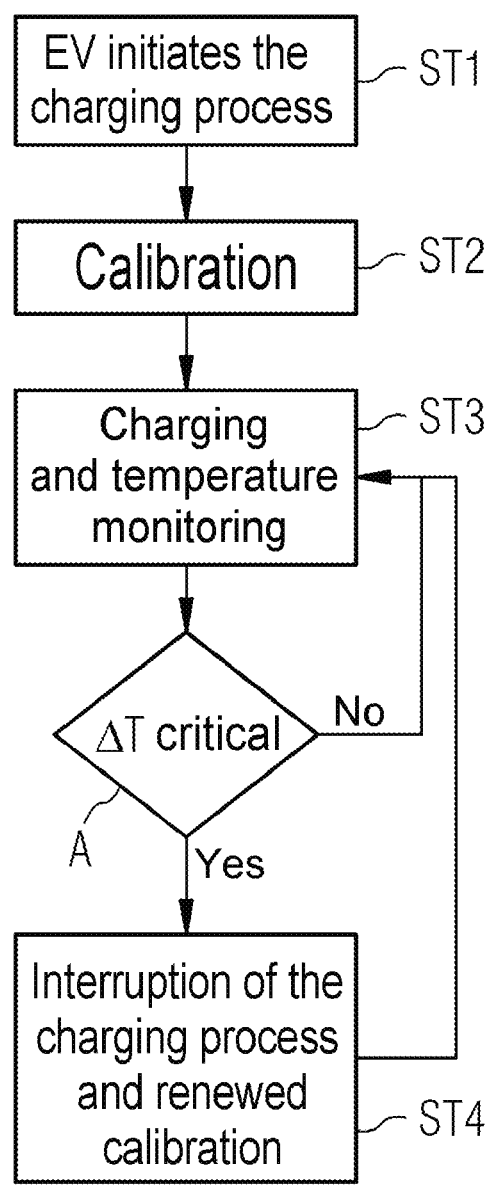

METHOD FOR CHARGING AN ELECTRICALLY OPERATED VEHICLE WITH THE AID OF A CHARGING CABLE, CHARGING CABLE AND RESIDUAL CURRENT ARRANGEMENT FOR DETECTING A DIRECT CURRENT

PRIORITY STATEMENT

The present application hereby claims priority under 35 U.S.C. § 119 to German patent application number DE 102016216401.5 filed Aug. 31, 2016, the entire contents of which are hereby incorporated herein by reference.

FIELD

At least one embodiment of the invention generally relates to a method for charging an electrically operated vehicle with the aid of a charging cable, to a charging cable and to a residual current arrangement for detecting a direct current.

BACKGROUND

Charging cables for charging electric vehicles are typically made safe by residual current devices (the abbreviation RCD is usually also used) which are integrated in the charging cable. Sometimes, the use of RCDs which are tripped both in the case of alternating current and in the case of direct current is required in this case. RCDs of this kind are called "type B RCDs" or "universal current-sensitive residual current devices".

By way of example, RCDs with a rated residual current of 6 mA are used in charging cables. Particularly in the case of type B RCDs, it is necessary to ensure the requisite sensitivity and stability of the switching properties. This is because electronic components always have tolerances and temperature coefficients. In addition, a certain degree of aging, which causes deviations in the values of the RCDs, arises during the soldering process onto the printed circuit board and also when loaded during operation. Specifically charging cables which have an RCD function are subject to these influences to a greater extent than normal RCDs, which are installed in electrical distributors, owing to the use conditions. In particular, the fluctuations in respect of temperature and current loading are even greater in the case of charging cables, and this can have a strong influence on the inaccuracy of measurements which are relevant for tripping the RCD.

SUMMARY

At least one embodiment of the invention improves the use of a residual current arrangement for detecting a direct current in a charging cable.

Embodiment of the invention are directed to methods for charging an electrically operatable vehicle with the aid of a charging cable, a charging cable, and/or a residual current arrangement for detecting a direct current.

Two methods for charging an (at least partially) electrically operatable vehicle with the aid of a charging cable which is formed with a residual current arrangement for detecting a direct current are proposed in embodiments of the present invention. Both methods can also be used in combination.

In the first method of at least one embodiment, a charging process, to be performed once again, is identified by the charging cable (typically as part of a message exchange operation between a control unit of the charging cable and the vehicle to which it is connected for the charging process; but also other realizations, for example also by way of manual input as a trigger that a charging process should be started, are conceivable). Before the charging process is started, a calibration of the residual current device is performed according to at least one embodiment of the invention.

In a method of at least one embodiment for an electrically operatable vehicle, chargeable via a charging cable formed with a residual current arrangement for detecting a direct current, the method includes:

identifying a charging process of the electrically operated vehicle to be performed, via a charging cable; and performing a calibration of the residual current arrangement prior to performing the charging process.

In an embodiment, the calibration can involve adjusting at least one parameter in a formula which is used for calculating the residual current. This calibration is preferably carried out before each charging process. However, it is also possible to carry out the calibration only before specific charging processes, that is to say that a calibration of the residual current arrangement, which calibration precedes the charging process, is performed for each charging process for which an additional criterion which relates to the requirement of a calibration is met. In this case, carrying out the calibration can depend on parameters such as the number of charging processes without calibration (for example implemented by way of incrementing a counter), the time elapsed since the last calibration, a parameter which is delivered with the aid of sensors (for example temperature or temperature difference) or a combination of parameters of this kind.

According to a second method of at least one embodiment, a temperature monitoring operation is carried out during the charging process and a value for the change in temperature is ascertained. When a threshold value for the change in temperature is exceeded, the charging process is interrupted and a calibration of the residual current device is performed. This method can be applied on its own or in combination with the first method of at least one embodiment.

In a method of at least one embodiment for an electrically operatable vehicle, chargeable via a charging cable formed with a residual current arrangement for detecting a direct current, the method comprises:

monitoring a temperature during a charging process of the electrically operated vehicle;

ascertaining a value representing a change in the monitored temperature; and interrupting the charging process, upon a threshold value being exceeded by the ascertained value, and calibrating the residual current device upon interrupting the charging process.

BRIEF DESCRIPTION OF THE DRAWINGS

The invention will be explained in more detail below using an example embodiment on the basis of figures, in which:

FIG. 3: shows a method according to an embodiment of the invention.

DETAILED DESCRIPTION OF THE EXAMPLE EMBODIMENTS

Figure 1:
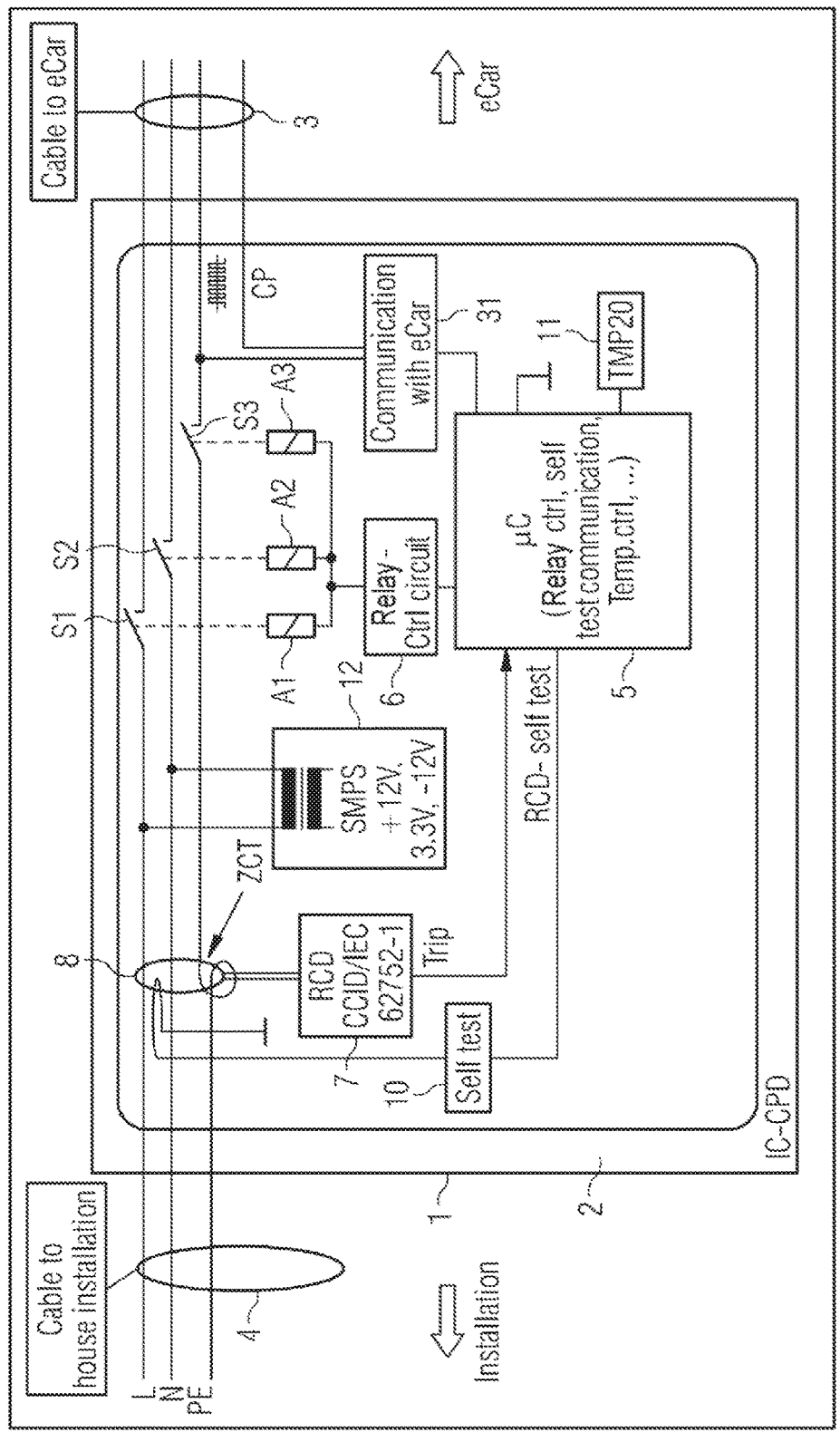
FIG. 1: shows a charging cable.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (procesor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In the first method of at least one embodiment, a charging process, to be performed once again, is identified by the charging cable (typically as part of a message exchange operation between a control unit of the charging cable and the vehicle to which it is connected for the charging process; but also other realizations, for example also by way of manual input as a trigger that a charging process should be started, are conceivable). Before the charging process is started, a calibration of the residual current device is performed according to at least one embodiment of the invention. In this case, the calibration can involve adjusting at least one parameter in a formula which is used for calculating the residual current.

This calibration is preferably carried out before each charging process. However, it is also possible to carry out the calibration only before specific charging processes, that is to say that a calibration of the residual current arrangement, which calibration precedes the charging process, is performed for each charging process for which an additional criterion which relates to the requirement of a calibration is met. In this case, carrying out the calibration can depend on parameters such as the number of charging processes without calibration (for example implemented by way of incrementing a counter), the time elapsed since the last calibration, a parameter which is delivered with the aid of sensors (for example temperature or temperature difference) or a combination of parameters of this kind.

According to a second method of at least one embodiment, a temperature monitoring operation is carried out during the charging process and a value for the change in temperature is ascertained. When a threshold value for the change in temperature is exceeded, the charging process is interrupted and a calibration of the residual current device is performed. This method can be applied on its own or in combination with the first method of at least one embodiment.

In the case of the above-described method of at least one embodiment, the residual current arrangement can be formed with an offset adder, and the calibration of the residual current arrangement can comprise the calibration of the offset adder. In this case, the offset adder can also be the only calibrated element. According to one embodiment, the charging cable can be formed with switches with which a current connection between the current source and the vehicle to be charged can be established and, respectively, can be interrupted. In this embodiment, the calibration of the offset adder is carried out with switches open. That is to say, when the calibration interrupts the charging process, the switches are opened for the calibration of the offset adder (and then closed again when the calibration for continuing the charging process is required).

According to one refinement of the subject matter of at least one embodiment of the invention, the residual current arrangement is formed with an amplifier. In this refinement, the calibration of the residual current arrangement comprises the calibration of the amplifier. In this case, it is also possible for only one calibration of the amplifier to take place. As an alternative, other elements, for example an offset adder, are additionally calibrated.

According to one variant of at least one embodiment of the above-described calibration of an amplifier, the charging cable is formed with switches with which a current connection between the current source and the vehicle to be charged can be established and, respectively, can be interrupted, and the calibration of the amplifier is carried out with switches open or closed. The switches would then be closed for the calibration of the amplifier if required, for example when a calibration of an offset adder had been carried out previously. It is also possible for the switches to be opened again after completion of the calibration of the amplifier when this is required for continuing the calibration or for the purpose of interrupting the charging process.

In the case of the above refinements of the subject matter of embodiments of the invention, the calibration can be carried out by adjusting at least one parameter in a formula which is used for the calculation of the residual current, for example of a parameter which relates to an offset adder or amplifier.

The subject matter of at least one embodiment of the invention is also a charging cable which is designed for charging an (at least partially) electrically operated vehicle by way of a method according to at least one embodiment of the invention. This charging cable may also be, in particular, a three-phase charging cable with three phase conductors, a neutral conductor and a ground conductor.

A further subject matter of at least one embodiment of the invention is a residual current arrangement for detecting a direct current. The residual current arrangement according to the invention is formed with an excitation circuit for generating an oscillating field current for the purpose of inducing a magnetic field in a current transformer (for example core-balance current transformer). A measurement circuit for detecting a current which is generated by the current transformer is further provided. Finally, the residual current arrangement also comprises a signal processing circuit for eliminating a component of the current which is generated by the current transformer, the component being caused by the field current.

FIG. 1 schematically illustrates a charging cable. This charging cable for electric vehicles comprises a phase conductor PE, a neutral conductor N and a ground conductor PE. The charging cable may be, for example, a three-phase charging cable with three phase conductors. However, for the sake of simplicity, an example embodiment with one phase conductor is described in detail in the text which follows. The electronics of the charging cable are arranged in a unit 1 in a manner protected by a housing 2, the unit being looped into the charging cable. This unit is often called a residual current arrangement, or more specifically an IC-CPD (in-cable control and protecting device). Some constituent parts of IC-CPD units which are not relevant to the invention are not shown in the figure.

The conductors L, N and PE are connected via switches S1, S2 and S3. The switches are typically open and are closed for a charging process via electromechanical drives A1, A2 and A3 for a charging process. The heart of the IC-CPD unit 1 is the microcontroller 5 which controls opening and closing of the switches S1, S2 and S3 via the circuit 6. The microcontroller is also responsible for the communication 31 or the exchange of control signals with electric vehicles to be charged (connection side identified by reference symbol 3) and is supplied with energy via the switched-mode power supply unit 12 via the phase conductor L and the neutral conductor N.

In a charging process, current is transmitted to an electric vehicle from a building-side energy source (connection side identified by reference symbol 4) via the charging cable. Proper operation of the charging process is ensured by way of a core-balance current transformer 8 and an RCD 7. In the case of a relevant residual current, this would be reported to the microcontroller 5 via the RCD 7 and the switches would be opened via the control circuit 6 and the electromechanical drives A1, A2 and A3. A circuit 10 for tests which relate to the RCD 7 is provided. Finally, there is a temperature sensor 11 in order to interrupt the charging process by way of the microcontroller 5 in the event of excessively high temperatures.

Figure 2:
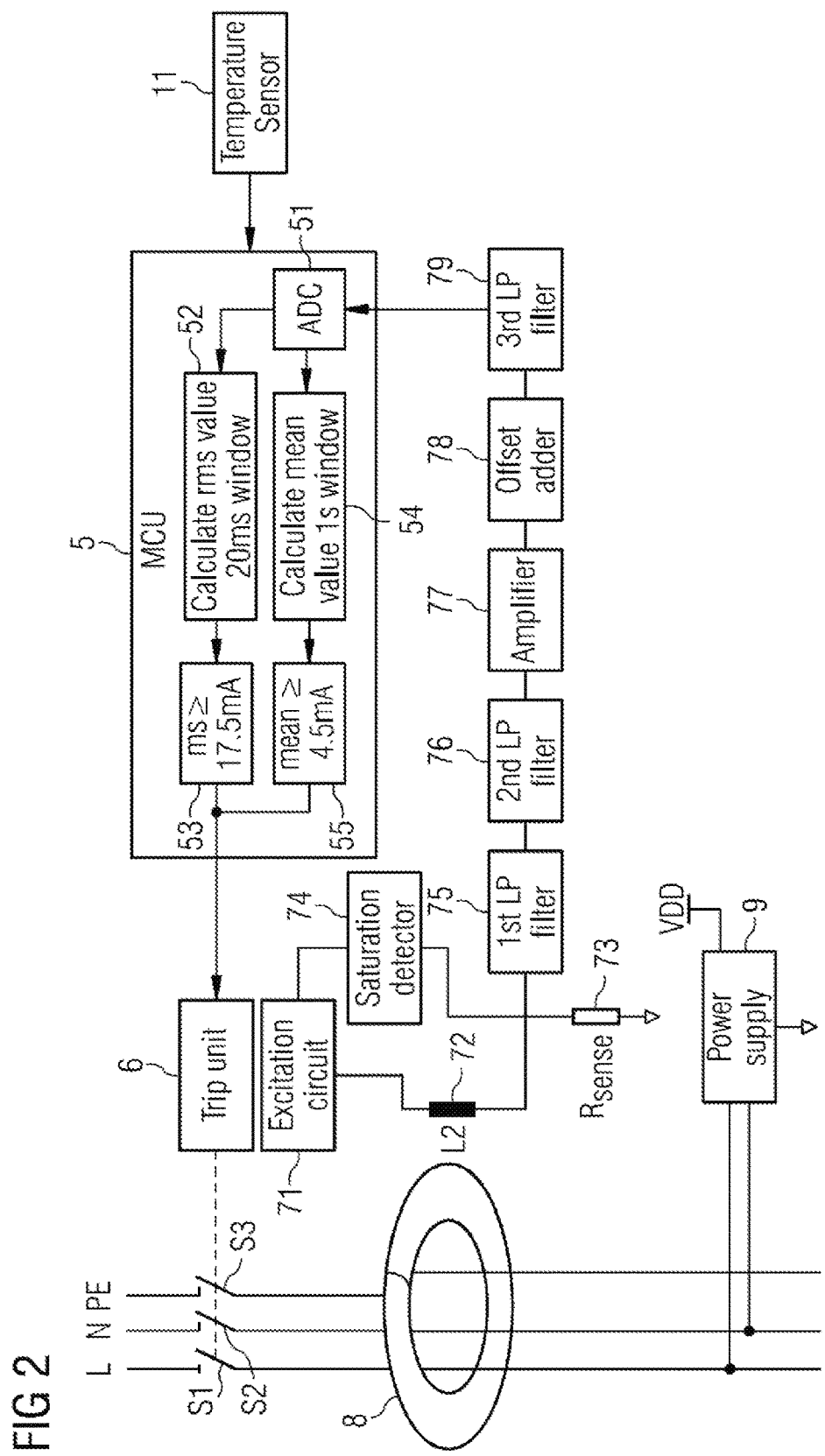
FIG. 2: shows a residual current arrangement.

Type B RCDs have to identify residual current in a frequency range of from 0 Hz to at least 1 kHz. Standard RCDs use a ZCT (zero current transformer) in order to add up the magnetic fields of the load currents in all of the conductors and transform the differential current (residual current) into the secondary winding of the ZCT. The principle of current transformation does not work in the case of DC currents, that is to say direct currents. For this reason, the flux gate principle from FIG. 2 is usually used for measuring DC residual currents. The phase conductors L, N and PE are shown again. An excitation circuit 71 (energy supply to the excitation circuit 71 via element 9) generates a field current. The field current is an alternating current which periodically drives the magnetic core of the current transformer 8 with the aid of the inductor 72 from one saturation point to the opposite saturation point (saturation detection via detector 74). In this case, an average magnetic field of 0 A/m is generated. Owing to a magnetic field strength of 0 A/m being generated, a compensation current is also generated when there is a residual current. The value of the compensation current $i_{comp}$ is:

$$i_{comp} = \frac{i_\Delta}{N_2}$$

This current leads to a voltage drop across the measurement resistor 73. A signal processing circuit with the low-pass filters 75 and 76 eliminates the influence of the field current. An amplifier 77 amplifies the signal and an adder 78 adds an offset, so that the signal can be measured with the aid of an analog/digital converter (below: AD converter) 51 which is arranged in a microcontroller 5 after filtering via a further low-pass filter 79. The residual current is calculated using the following formula:

$$i_\Delta(t) = \frac{(V_{ADC}(t) - V_o) \cdot N_2}{R_{sense} \cdot S}$$

Here, S is the amplification factor, $V_{ADC}$ is the digitized voltage across the AD converter, $V_O$ is the added offset voltage, $N_2$ is the secondary number of windings of the transformer or the number of windings of the inductor 72, and $R_{sense}$ corresponds to the non-reactive resistor 73 in FIG. 2.

The microcontroller 5 calculates the value of the residual current. The rms value (rms is the abbreviation for "root mean square" and indicates the effective value of the current) is calculated (reference symbol 52 in FIG. 2) in a defined time window $t_{rms}$ (for example 20 ms):

$$i_{\Delta,rms} = \sqrt{\frac{1}{t_{rms}} \cdot \int_{t_0}^{t_0+t_{rms}} i_\Delta(t)^2 \cdot dt}$$

If the calculated current is greater than 75% of the rated residual current, an error counter is incremented. If the error counter reaches a predefined limit value, the charging cable is disconnected. The maximum value for the error counter, the limit value for the current and the length of the time window can vary and depend on the value of the current. The mean value of the current in the time window 1 s is additionally calculated (reference symbol 54) in FIG. 2. According to FIG. 2, criteria both for the RMS value (reference symbol 53) and also for the mean value (reference symbol 55) are used for tripping. The figure likewise shows a temperature sensor 11 which is arranged in the microcontroller 5 and shows a unit 6 for opening and, respectively, closing the switches S1-S3.

Highly sensitive RCDs with a rated residual current of 6 mA are required: the amplification factor S has to be high and the offset 1.65 V has to remain as constant as possible.

The inaccuracies of this DC offset $V_O$ cannot be distinguished from DC residual currents. In addition, the signal conditioning has to have a high amplification factor S; this factor can also vary greatly with the temperature.

Therefore, the DC offset $V_o$ and the amplification S are calibrated before each charging operation and in the event of a significant change in temperature (for example in the case of a deviation of +/− 40 K). The relays and, respectively, the switches are open for calibration purposes, in order to rule out a real residual current. The temperature during the calibration is also recorded together with the calibration values. If there is a significant change in the temperature, the charging process is briefly interrupted and the calibration is carried out once again. The IC-CPD module then continues to be automatically charged.

This is described in more detail in FIG. 3. In a first step ST1, the electric vehicle initiates the charging process. A corresponding signal is received by the IC-CPD module and identified as a command for starting a charging process. In this case, communication is made between the charging cable and the electric vehicle, for example, via a pulse-width-modulated signal (PWM signal), as is described, for example, in DE 10 2012 217 447 A1 and the standard IEC TS 62763, the entire contents of each of which are hereby incorporated herein by reference. A first calibration is carried out in step ST2 before the charging process is started.

During the charging process, the temperature at the IC-CPD module is monitored. Temperature measurement is already provided in a wide variety of charging cables and described, for example, in documents WO 2010/049775 A2 and DE 10 2011 084 527 A1, the entire contents of each of which are hereby incorporated herein by reference. The magnitude of the difference between the measured temperature values and the temperature value measured during the first calibration is continuously calculated and checked to determine whether it exceeds a threshold value (step ST3). Here, "continuously" can mean that the calculation is made at time intervals which are small in relation to the total charge time. If the threshold value is exceeded (query A in FIG. 3), the charging process is interrupted in step ST5 and calibration is performed once again. The temperature measured during this calibration is used for calculating the difference in step ST3 as the method is further carried out, that is to say the monitoring of the temperature difference is always related to the temperature at the last calibration.

The changes owing to aging are also rendered invalid owing to the regular calibration.

The calibration comprises 2 steps:
a) measurement of the signal without test current→ offset is calibrated
b) measurement of the signal with test current→ amplification of the signal conditioning is calibrated.

The calibration of the amplification is optional and can be restricted, for example, to the first calibration before beginning the charging process. Specifically, the calibration takes place by adjusting the relevant parameters in the above formula for determining the residual current, which adjustment is carried out by the microcontroller.

The test current is switched using a separate test winding. The same test circuit can be used for regularly checking the functioning of the device (test button, self-test) and is already present in some charging cables. A corresponding circuit is described, for example, in DE 10 2014 210 589 A1, the entire contents of which are hereby incorporated herein by reference. The microcontroller (reference symbol 5 in FIG. 1 and FIG. 2) controls the switching of the test current.

According to at least one embodiment of the invention, an RCD function with a very high degree of sensitivity in the case of DC currents for the highly non-uniform conditions, as occur in the charging cable application, can be realized in this way. The regular calibration allows a high degree of reliability without this being associated with a cost disadvantage.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for an electrically operatable vehicle, chargeable via a charging cable formed with a residual current arrangement for detecting a direct current, the method comprising:
   providing a charging cable having a controller configured to communicate with the electrically operatable vehicle;
   identifying, via the controller of the charging cable, a charging process of the electrically operated vehicle to be performed; and
   performing a calibration of the residual current arrangement for detecting a direct current prior to performing the charging process.

2. The method as claimed in claim 1, wherein the calibration of the residual current arrangement is performed prior to performing each of a plurality of charging processes, including the identified charging process.

3. The method as claimed in claim 1, the calibration of the residual current arrangement is performed prior to performing each of a plurality of charging processes, including the identified charging process, for which an additional criterion which relates to a requirement of a calibration is met.

4. The method of claim 1, further comprising:
beginning performance of the identified charging process to charge the electrically operated vehicle;
monitoring a temperature during the performance of the identified charging process;
ascertaining a value representing a change in the monitored temperature; and
interrupting the performance of the charging process, upon a threshold value being exceeded by the ascertained value, and performing the calibration of the residual current arrangement during the interrupting of the performance of the charging process.

5. A charging cable, designed to charge an electrically operated vehicle, the charging cable including an in-cable control and protecting device configured to:
identify a charging process of the electrically operated vehicle to be performed, via the charging cable; and
perform a calibration of a residual current arrangement for detecting a direct current prior to performing the charging process.

6. The charging cable of claim 5, wherein the charging cable is a three-phase charging cable with three phase conductors, a neutral conductor and a ground conductor.

7. A residual current arrangement for detecting a direct current, comprising:
an offset adder;
an amplifier;
an excitation circuit to generate an oscillating field current to induce a magnetic field in a current transformer;
a measurement circuit to detect a current generated by the current transformer; and
a signal processing circuit to eliminate a component of the current generated by the current transformer, the component being caused by a field current, wherein calibration of the residual current arrangement includes calibrating the offset adder, and wherein the calibration of the residual current arrangement includes calibrating the amplifier.

8. The method of claim 2, further comprising:
carrying out a temperature monitoring operation during performance of the charging process;
ascertaining a value for a change in the monitored temperature; and
interrupting the charging process, upon a threshold value being exceeded by the ascertained value, and performing the calibration of the residual current arrangement during the interruption.

9. The method of claim 3, further comprising:
carrying out a temperature monitoring operation during performance of the charging process;
ascertaining a value for a change in the monitored temperature; and
interrupting the charging process, upon a threshold value being exceeded by the ascertained value, and performing the calibration of the residual current arrangement during the interruption.

10. The method of claim 1, wherein the residual current arrangement includes an offset adder, and wherein the calibration of the residual current arrangement includes calibrating the offset adder.

11. The method of claim 4, wherein the residual current arrangement includes an offset adder, and wherein the calibration of the residual current arrangement includes calibrating the offset adder.

12. The method of claim 11, wherein the charging cable includes switches, each with which a current connection between a current source and the electrically operatable vehicle to be charged is respectively establishable and interruptable, and wherein, upon the interrupting of the charging process, the switches are opened during the calibrating of the offset adder.

13. The method of claim 1, wherein the residual current arrangement includes an amplifier, and wherein the calibrating of the residual current arrangement includes the calibrating of the amplifier.

14. The method of claim 1, wherein the calibration is carried out by adjusting at least one parameter in a formula which is used for calculating a residual current.

15. The charging cable of claim 5, wherein the calibration of the residual current arrangement is performed prior to performing each of a plurality of charging processes, including the identified charging process.

16. The charging cable of claim 5, wherein the calibration of the residual current arrangement is performed prior to performing each of a plurality of charging processes, including the identified charging process, for which an additional criterion which relates to a requirement of a calibration is met.

17. The charging cable of claim 5, wherein the charging cable, including the in-cable control and protecting device, is further configured to:
begin performance of the identified charging process to charge the electrically operated vehicle;
monitor a temperature during the performance of the identified charging process;
ascertain a value representing a change in the monitored temperature; and
interrupt the performance of the charging process, upon a threshold value being exceeded by the ascertained value, and perform the calibration of the residual current arrangement during interrupting of the performance of the charging process.

18. The charging cable of claim 5, wherein the in-cable control and protecting device includes the residual current arrangement.

19. A charging cable, designed to charge an electrically operated vehicle, the charging cable including an in-cable control and protecting device configured to:
monitor a temperature during a charging process of the electrically operated vehicle;
ascertain a value representing a change in the monitored temperature; and
interrupt the charging process, upon a threshold value being exceeded by the ascertained value, and calibrate a residual current arrangement upon interrupting the charging process.

20. The charging cable of claim 19, wherein the charging cable is a three-phase charging cable with three phase conductors, a neutral conductor and a ground conductor.

21. The charging cable of claim 19, wherein the residual current arrangement includes an offset adder, and wherein the calibrating of the residual current arrangement includes calibrating the offset adder.

22. The charging cable of claim 19, wherein the charging cable includes switches, each with which a current connection between a current source and the electrically operatable vehicle to be charged is respectively establishable and interruptable, and wherein, upon the interrupting of the charging process, the charging cable including the residual current arrangement is further configured to open the switches during the calibrating of an offset adder.

23. The charging cable of claim 19, wherein the residual current arrangement includes an amplifier, and wherein calibrating of the residual current device includes the calibrating of the amplifier.

24. The charging cable of claim 19, wherein the in-cable control and protecting device includes the residual current arrangement.

\* \* \* \* \*